(12) United States Patent
Livesey et al.

(10) Patent No.: US 6,492,993 B1
(45) Date of Patent: Dec. 10, 2002

(54) METHOD AND SYSTEM FOR GENERATING RAILING OBJECTS

(75) Inventors: Martin Livesey, San Francisco, CA (US); Martin M. Konopken, legal representative, Novato, CA (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/310,896

(22) Filed: May 12, 1999

(Under 37 CFR 1.47)

Related U.S. Application Data

(60) Provisional application No. 60/085,436, filed on May 14, 1998.

(51) Int. Cl.[7] .............................. G06F 17/00; G06T 1/00
(52) U.S. Cl. ....................... 345/588; 418/619; 418/782; 418/764; 418/501
(58) Field of Search .............................. 434/72–80, 323, 434/327; 700/32, 98, 230; 716/11, 13; 345/418, 419, 420, 619, 621, 681, 588, 421, 801, 782, 773, 501, 764, 769, 765, 798, 848, 849–855; 29/23 R, 712

(56) References Cited

U.S. PATENT DOCUMENTS

| 4,829,445 A | * | 5/1989 | Burney ...................... 700/230 |
| 5,737,236 A | * | 4/1998 | Maziasz ..................... 364/490 |
| 5,901,065 A | * | 5/1999 | Guruswamy ................ 364/491 |
| 6,006,024 A | * | 12/1999 | Guruswamy ........... 395/500.13 |
| 6,032,343 A | * | 3/2000 | Blanch et al. ................ 29/712 |

OTHER PUBLICATIONS

King Douglas, "comples modeling made easy: a step–by–step . . . without the use of CAD", May 1994, ISSN: 0271–4159, v17, n5, p49 (3).*

* cited by examiner

*Primary Examiner*—Matthew Luu
*Assistant Examiner*—Wesner Sajous
(74) *Attorney, Agent, or Firm*—Hickman Palermo Truong & Becker LLP; Carl L. Brandt; Craig G. Holmes

(57) ABSTRACT

A method and system are described for generating railing objects that model railing structures, such as fences. According to the method, a railing object is generated along a path within a design layout. As rendered, the railing object includes posts and railings, with the option of using filling material between the posts. According to one variation, the railing object substantially follows an existing path. The railing object may comprise an increasing number of segments to better follow the curvature of the path. Any modification applied to the path is automatically applied to the railing object after the railing object is applied to the path. That is, every railing object component (e.g. post, railing, fencing) will be repositioned along the new position of the path. A mechanism is provided for automatically applying the modifications to the geometric dimensions of a single component instance of a railing object to every instance of that component on the railing object. A mechanism is also provided for positioning corners in the railing object to match corners on the path.

16 Claims, 10 Drawing Sheets

METHOD AND SYSTEM FOR GENERATING RAILING OBJECTS

This patent application claims priority from U.S. Provisional Patent Application No. 60/085,436, filed on May 14, 1998, entitled METHOD AND SYSTEM FOR MANIPULATING DIGITAL VISUAL INFORMATION, which is hereby incorporated by reference in its entirety.

FIELD OF THE INVENTION

The present invention generally relates to computer software, and more specifically to a method for generating a railing structure.

BACKGROUND OF THE INVENTION

Computer hardware and computer software programs have revolutionized the way we work, shop, and do business. In general, computers have increased our productivity by providing a mechanism that allows us to do more in less time. For example, many labor and time intensive tasks of the past, such as ledge bookkeeping and mathematical problem-solving are now performed in a number of minutes using a variety of accounting and statistical computer programs. In addition, computers have also enhanced the productivity of both architects and engineering designers. Today, few architecture schematics are created at a drafting table with pencils, drafting paper, and rulers. Instead, three-dimensional architecture and landscape designs are typically conceptualized and modeled through the use of computer software programs.

For example, architecture design programs, generally known as computer aided design (CAD) programs, provide a designing tool that allows architects, interior designers, land planners, and civil engineers to conceptualize and present design layouts. By simulating the layout of a particular design, a significant reduction in manufacturing costs may be realized as mistakes can be identified and corrected prior to the construction or manufacture of particular a design.

In general, CAD applications are particularly helpful in conceptualizing design layouts that traditionally have been tedious, laborious, and time intensive processes to perform. In addition, the overall design process has been aided by the increased development of easy to use control software, commonly referred to as a graphical user interface (GUI). For example, most CAD applications include some sort of GUI. These GUIs provide a user interface in which a user may use a mouse or other cursor input control device to select (point and click) and/or move (drag and drop) objects on a visual display. Many GUIs also include user friendly menus such as toolbars or other types of pull-down menus that allow users to select from a variety of cursor control options.

In general, CAD applications typically include the ability to add text, to paint, to rotate, or to move or place an object in a scene, or to undo or redo a previous action. In addition, many CAD applications further allow the user to add shading and lighting to an object, to view the design from various viewpoints, to zoom in on a particular component, to rotate and scale components, or to change the geometry of a component. These features provide ease of use in producing conceptual designs and the presentation of numerous design concepts from different visual perspectives.

Notwithstanding the great technological advances in computerized architectural design programs, certain labor intensive tasks persist, albeit on a computer. One labor intensive task that has persisted relates to the drafting and manipulation of railing structures. In this context, a railing structure is broadly defined as any structure that includes:

(1) a first set of one or more components that extend from a path, such as posts in a fence, and (2) a second set of one or more components, such as a hand rail on a banister, that intersect the first set of components in such a manner that the spacing between the points at which the components in the first set intersect a component in the second set remains substantially constant.

For the purpose of explanation, components that belong to the first set of components shall be referred to herein as "post components", and components that belong to the second set of components shall be referred to herein as "rail components". However, it should be noted that these terms do not imply that the components have any visual similarity to conventional posts or rails. Railing structures may include, but are not limited, to such structures as fences, hand railings, balustrades, railroad tracks or any other structures that satisfy the definition provided above.

A drawback with designing railing structures, using CAD or similar architecture design software applications, is that they require tedious and time-consuming manual positioning and placement (e.g. "drag and drop") of each railing structure component onto the design layout or scene. For example, not only would the construction of a fence require the drafter to manually and precisely position each post, rail, and picket, but also to run the fence along a specific path in the design layout.

In addition, a user also has the drawback of having to ensure that each individual component has uniform dimensions (e.g. height, width, depth). A common method for ensuring that each component has a uniform dimension typically consists of the user creating a single component (e.g. a picket) and then copying it to create all of the other components of the same type. Once the components have been made, the user must meticulously place and associate the components to form the railing structure.

Another drawback with the current computer aided architectural design programs pertains to the manual updating of multiple components of the railing structure. For example, if the user determines that the dimensions of the pickets within a fence need to be modified or changed, the user will be required to individually perform the modification or change on every picket within the fence. In addition, if the user requires the fence to be moved to a different location within the design layout (i.e., follow a different path), the repositioning may require many, if not all, of the railing components to be manually repositioned within the layout.

Still another problem pertains to the structural model of the railing structure. Post components on a fence are generally placed by a user, for structural reasons, where the fence pivots from its original 180 degree direction along a path. However, if a user uses a spacing mechanism to evenly position post components along the path of a railing structure, then the mechanism may not place a post component where the fence pivots in a new direction. Therefore, the structural support of the fence appears unrealistic and awkward. To correct this appearance, users are left with the time and labor intensive task of identifying and then manually repositioning each post component at these pivotal positions.

If errors such as these are not discovered prior to the actual construction of a railing structure, a significant increase in preparatory and material costs may be realized due to a shortage in materials purchased or to the purchase of excess or inadequate materials.

Based on the foregoing, it is highly desirable to provide a mechanism that can reduce the time-consuming, labor intensive task of designing a railing structure.

It is also desirable to provide a mechanism that can reduce the time-consuming, labor intensive task of applying modifications to railing structures.

In addition, it is also desirable to provide a mechanism that can automatically identify where certain railing components, such as posts, are required to be located.

SUMMARY OF THE INVENTION

A method and system are provided for generating railing objects that model railing structures. By representing a potentially complex railing structure using a single object, a modeling tool is able to perform automatically many of the operations that would otherwise require manual component-by-component manipulations by a user. According to the method, a railing object, comprising post components and rail components, is generated along a path within a design layout, with the option of using filling material between the post components.

According to one embodiment, the railing object substantially follows an existing path. The railing object may comprise an increasing number of segments to better follow the curvature of the path. After a railing object is applied to a path, any modification applied to the path is automatically applied to the railing object. That is, every railing object component (e.g. post, railing, fencing) will be repositioned along the new position of the path.

According to another aspect, modifications to the geometric dimensions of a single component instance of a railing object are automatically applied to every instance of that component on the railing object.

According to another aspect, corners in the railing object are positioned to match corners on the path.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

A method and system for generating railing objects is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Hardware Overview

Figure 1:
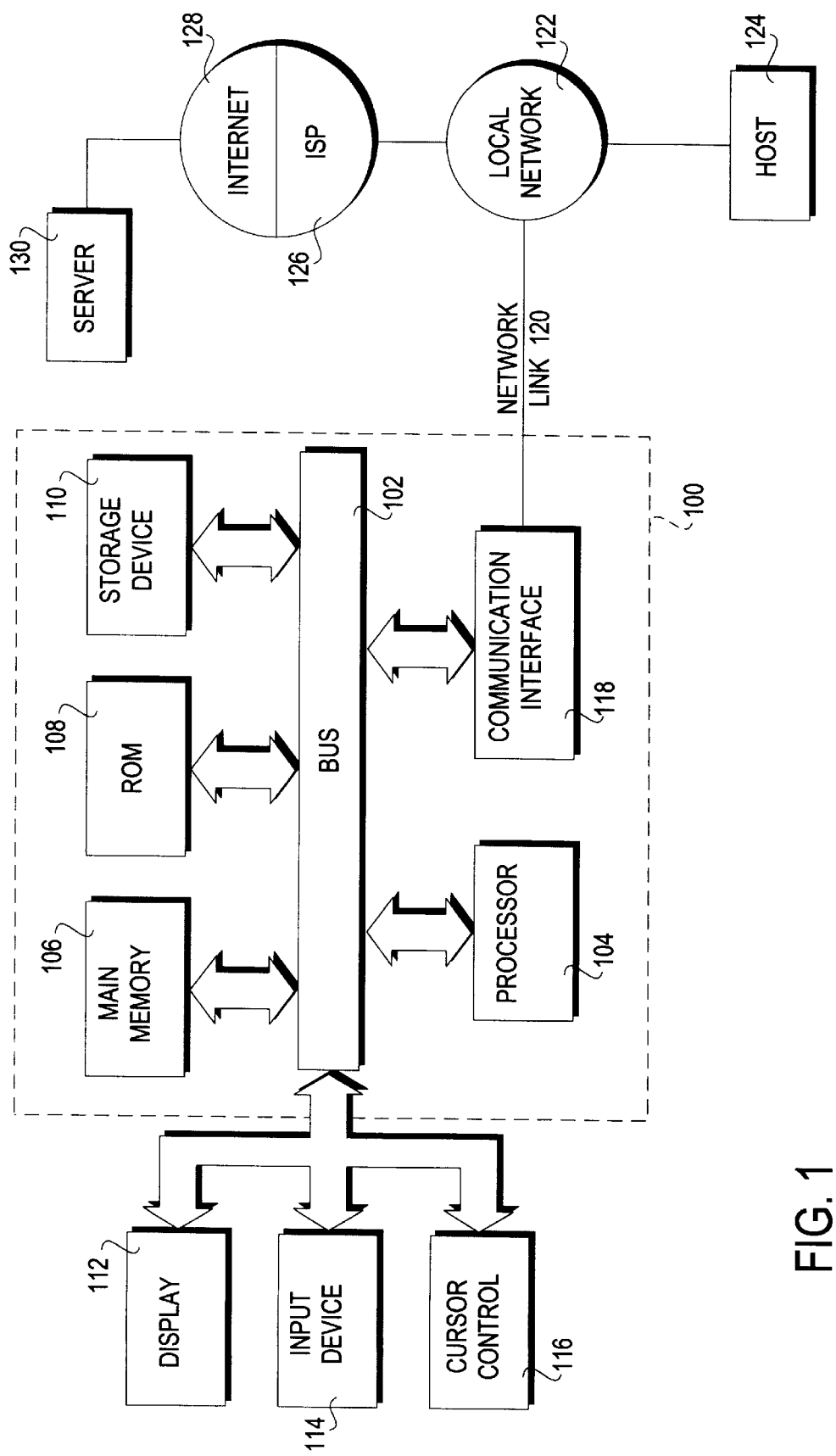
FIG. 1 is a block diagram of a computer system architecture in which the present invention may be used.

FIG. 1 is a block diagram that illustrates a computer system 100 upon which an embodiment of the invention may be implemented. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT), for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane.

The invention is related to the use of computer system 100 for generating a railing object. According to one embodiment of the invention, generating a railing object is provided by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media includes, for example, optical or magnetic disks, such as storage device 110. Volatile media includes dynamic memory, such as main memory 106. Transmission media includes coaxial cables, copper wire and fiber optics, including the wires that comprise bus 102. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be carried on a magnetic disk of a remote computer. The remote computer can load the instructions into its dynamic memory and send the instructions over a telephone line using a modem. A modem local to computer system 100 can receive the data on the telephone line and use an infra-red transmitter to convert the data to an infra-red signal. An infra-red detector can receive the data carried in the infra-red signal and appropriate circuitry can place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the world wide packet data communication network now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120 and communication interface 118. In the Internet example, a server 130 might transmit a requested code for an application program through Internet 128, ISP 126, local network 122 and communication interface 118. In accordance with the invention, one such downloaded application provides for generating a railing object as described herein.

The received code may be executed by processor 104 as it is received, and/or stored in storage device 110, or other non-volatile storage for later execution. In this manner, computer system 100 may obtain application code in the form of a carrier wave.

Railing Objects Overview

A railing tool is provided that allows a user to easily generate and position a railing object along a particular path. In one embodiment, the railing tool provides a user interface that allows a user to readily define the attributes associated with the components of a railing object. For example, the railing tool allows a user to easily define the quantity, the shape and the spacing of the rail and post components that are to be included in the railing object. In one embodiment, the railing tool allows a user to define a specific path that the railing object is to follow. The railing tool automatically causes the railing object to follow the defined path by positioning at least one end of each of the post components adjacent to the path.

In certain embodiments, whenever the path is modified or redefined, the railing object associated with the path automatically adjusts so as to follow the course of the modified path. By automatically adjusting to the redefined path, the user is relieved of the burden of having to meticulously adjust each of the components of the railing object so as to follow the modified path.

A railing object models a railing structure in that the railing object includes:
(1) one or more post component instances that represent the post components of the railing structure modeled by the railing object, and
(2) one or more rail components instances that represent rail components of the railing structure modeled by the railing object.

In addition, when the railing object is rendered, a visual depiction of a railing structure is produced in which the post components follow and extend from a path and in which the rail components intersect the post components in such a manner that the spacing between the points at which the post components intersect a rail component remains substantially constant.

Figure 2A:
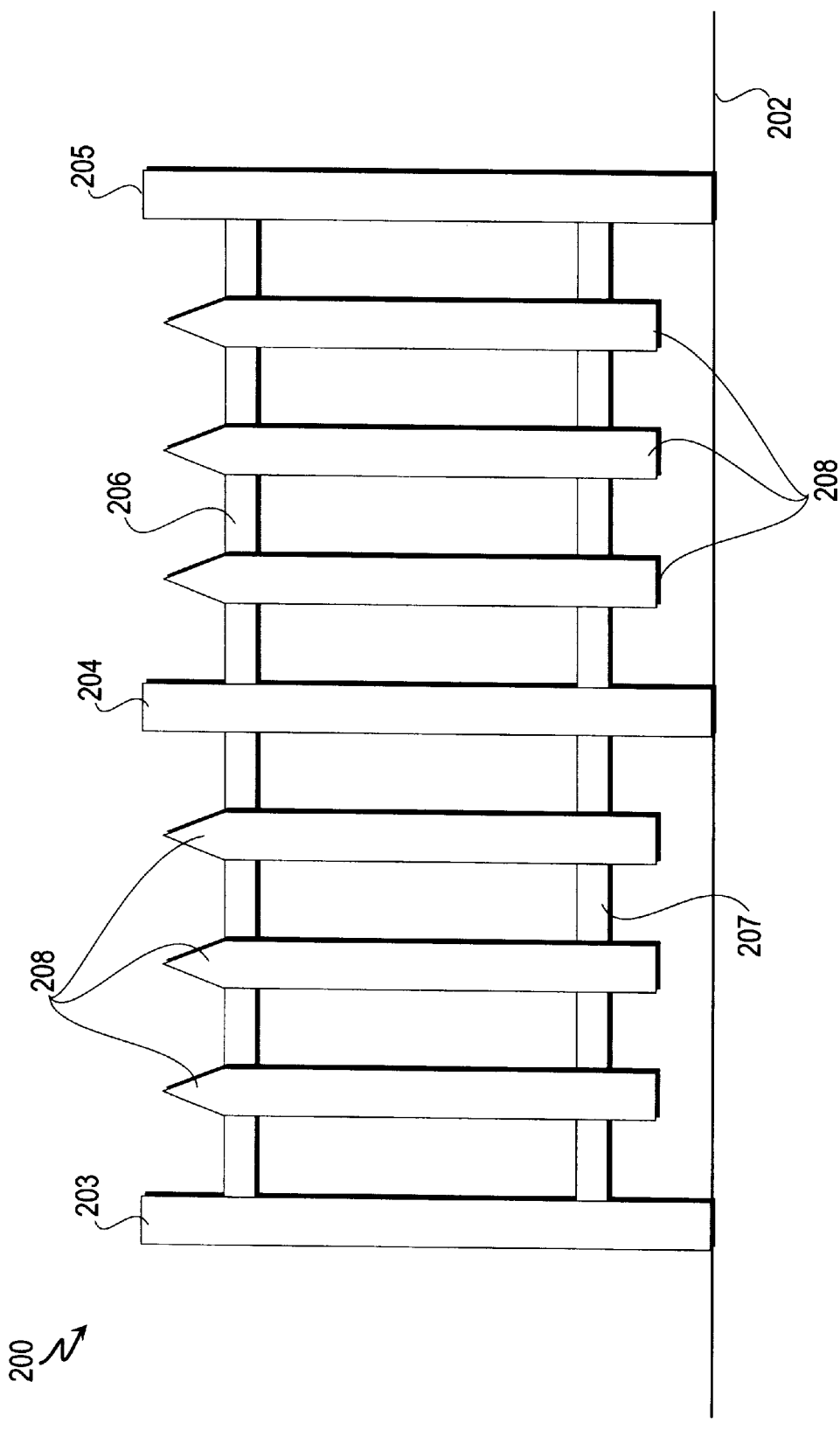
FIG. 2A illustrates the components of a fence type railing object.

The railing tool allows various types of railing objects to be generated for display in a design layout. FIG. 2A illustrates an example of a "fence" railing object 200 that has been generated to follow a path 202. In this example, railing object 200 includes substantially vertical post components 203, 204 and 205, substantially horizontal rail components 206 and 207, and a plurality of fencing components 208. As depicted, post components 203, 204 and 205 intersect rail components 206 and are generally spaced a particular distance apart along path 202. In this example, railing object 200 includes two separate sections; a first section being defined by post components 203 and 204 and a second section being defined by post components 204 and 205.

In this example, fencing components 208 represent "pickets" that intersect with substantially horizontal rail components 206 and 207. However, embodiments of the invention are not limited to any particular type of fencing component and the fencing component may even be eliminated in certain embodiments. For example, fencing components 208 may be replaced by one or more solid panels or may even be eliminated altogether.

Figure 2B:
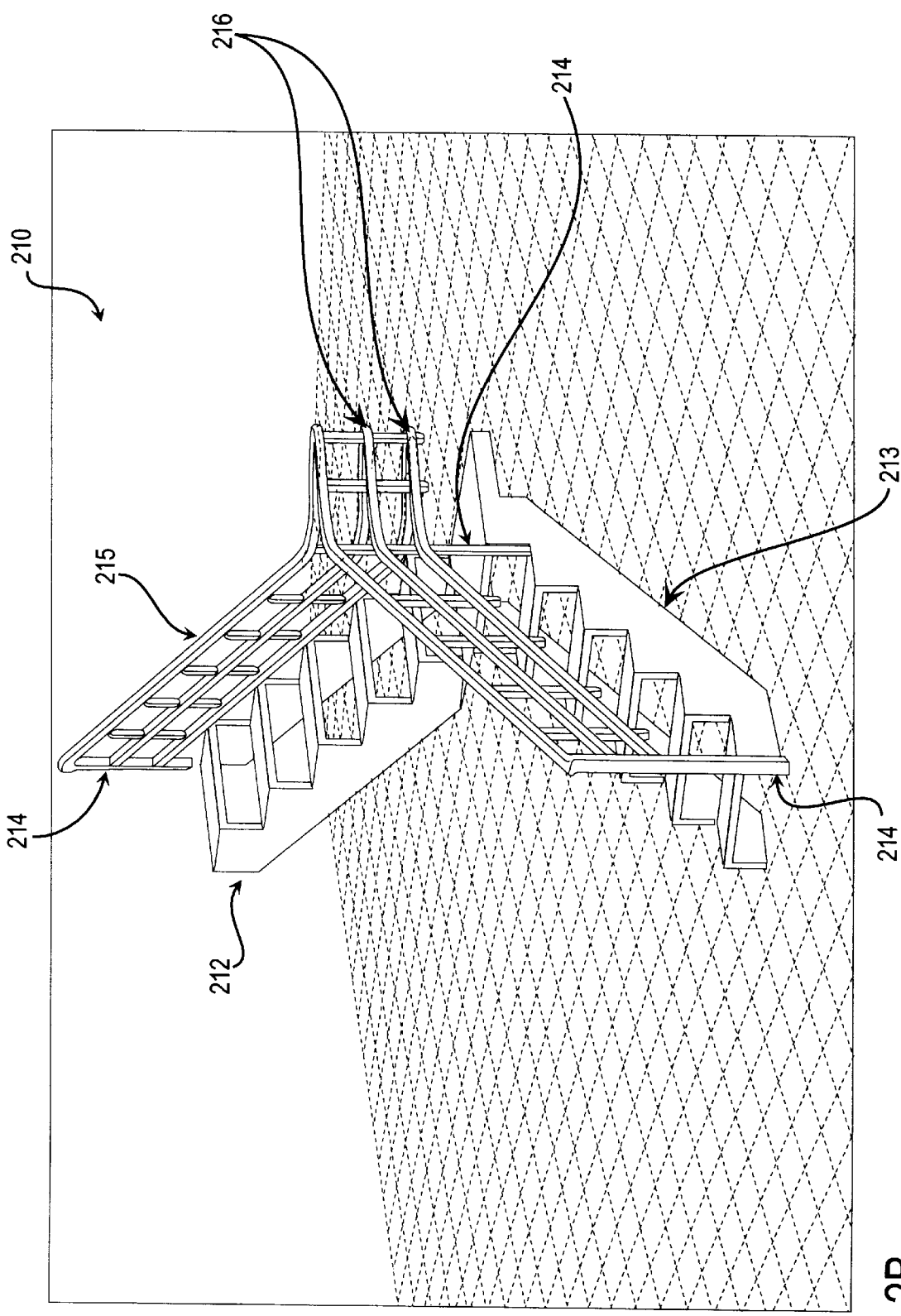
FIG. 2B illustrates the components of a stairway type railing object.

FIG. 2B illustrates another example of a railing object 210, in which the railing object 210 is depicted as a handrail which follows a path as defined by edge 213 of the stairs 212. Here, railing object 210 includes substantially vertical post components 214 and rail components top rail 215 and bottom rail 216.

At times, the modeling of a railing structure may require the top rail component to differ from the bottom rail components. Therefore, in certain embodiments of the invention, attributes, such as the profile, depth, width, and height, of a rail component may be modified by a user to more realistically model a particular shape or contour.

Railing Object User Interface Controls

As previously indicated, railing structures are typically difficult and time-consuming to model because each railing component must be meticulously modified if any updates are performed on the railing structure. Unlike physical building blocks, with fixed shape and size, the geometric components in one embodiment are parametric. That is, the dimensions, segment settings, and other features of the railing object can be changed after it is created. The benefits of using parametric objects are most evident when continually updating the design during development. Parametric objects respond to changes in their parameters by dynamically updating their properties.

For example, as will be described below, a user may change the profile of the pickets on a fence from a square profile to a round profile using the fencing dialog box 360. Because the design is made of parametric objects, all of the pickets along the railing object are automatically updated from the square profile to a round profile. Thus, by manipulating the attributes of the different railing components, the user can easily define and redefine how a particular railing object looks.

Figure 3:
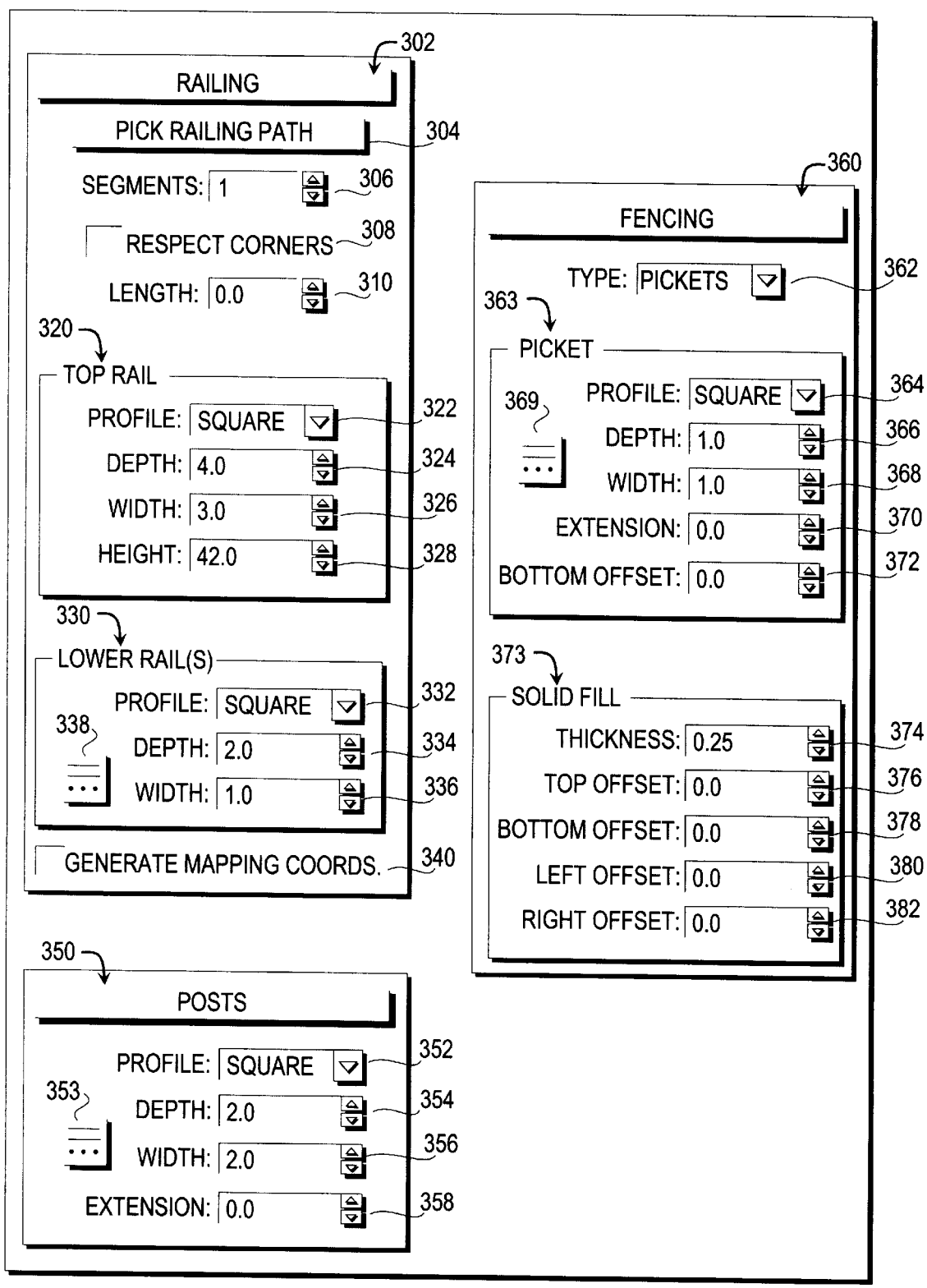
FIG. 3 illustrates an example of a user interface control menu that may be used to define a path and a railing object.

FIG. 3 illustrates a user interface control menu 300 that provides a mechanism for generating and modifying railing objects in accordance with certain embodiments of the invention. As depicted, user interface control menu 300 includes a railing dialog box 302, a post dialog box 350, and a fencing dialog box 360.

In this example, railing dialog box 302 includes a pick railing path button 304, a segments field selector 306, a respect corners toggle 308, a length field selector 310, a top rail definition section 320, a lower rail definition section 330, and a generate mapping coordinates toggle 340.

The pick railing path button 304 allows the user to define a path for which a railing object is to follow. The segments field selector 306 allows the user to define the number of segments the railing object will be divided into. In one embodiment, by increasing the number of segments, a user can cause a railing object to follow the curvature of the path more closely. By selecting the respect corners toggle 308 a user may cause the railing mechanism to automatically adjust or position a post component where the railing object pivots or bends a certain amount from its current bearing or course of direction. The functions that may be performed through the use of the pick railing path button 304, the segments field selector 306, and the respect corners toggle 308 controls are described in further detail below.

The length field selector 310 controls the overall length of the railing object. In one embodiment, the overall length of the railing object may be modified by selecting and dragging portions of a rendered railing object, by entering a numeric value in the length field selector 310, or by manipulating the spinner control associated with length field selector 310 to increase or decrease the length value.

The top rail definition section 320 controls the geometric dimensions of the top rail component. As depicted, the top rail definition section 320 includes a top rail profile box 322, a top rail depth box 324, a top rail width box 326, and a top rail height box 328.

The top rail profile box 322 allows the user to define the profile of the top rail component of the railing object. For example, a user may chose to generate top rails having either a round profile or a square profile.

The depth, width, and height dimensions of the top rail component may respectively be defined using top rail depth box 324, top rail width box 326, and top rail height box 328. In one embodiment, the depth, width, and height of a top rail may be modified by selecting and dragging portions of the rendered top rail component, by entering a numeric value in the respective field, or by manipulating the spinner controls associated with each box to increase or decrease their respective values.

The lower rail definition section 330 is used to define the geometric dimensions of lower rail components. As depicted, the lower rail definition section 330 includes a lower rail profile box 332, a lower rail depth box 334, a lower rail width box 336, a spacing tool button 338 and generate mapping coords. toggle 340.

The lower rail profile box 332 allows a user to define the profile of lower rail components of the railing object. In one embodiment, the user may select either a round or square lower rail profile in lower rail profile box 332.

The depth and width dimensions of the lower rail components may be defined respectively using lower rail depth box 334 and lower rail width box 336. In one embodiment, the depth and width of a lower rail may be modified by selecting and dragging portions of a rendered lower rail component, by entering a numeric value in the respective field, or by manipulating the spinner controls associated with each box to increase or decrease their respective values.

In response to selecting the spacing tool button 338, the user is presented with an interface that allows the user to define the number of lower railing components that are to be included in the railing object and the spacing between each of the lower rail components. For example, in one embodiment, selecting spacing tool button 338 causes a spacing tool interface to be displayed to the user. By interacting with the spacing tool, a user can define the number of, and the spacing between, each of the lower rail components. An example of a spacing tool that may be used to define the spacing of railing object components is described in detail in patent application Ser. No. 09/240,070, filed Jan. 29, 1999, entitled METHOD AND SYSTEM FOR DETERMINING THE SPACING OF OBJECTS, the contents of which is hereby incorporated by reference in its entirety.

Generate mapping coords. toggle 340 allows a user to select whether an object is to render mapped material. For example, in one embodiment, renderable objects have an option, "generate mapping coordinates", as a creation parameter. By selecting the mapping coords. toggle 340, a user can choose to have the parameter available to the object for rendering mapped material. In certain embodiments, each object type is associated with a specific default mapping coordinate setting.

The post dialog box 350 is used to define the geometric dimensions of the post components. The posts dialog box 350 includes a post profile box 352, a post depth box 354, a post width box 356, a post extension box 358 and a post spacing tool button 353.

The post profile box 352 allows the user to define the profile of the post components. In one embodiment, the post profile box 352 enables the user to select from a post profile from a set of predefined profiles. For example, in certain embodiments the user may select from a set of predefined profiles that include a round profile, a square profile or a profile of "none". By selecting a profile of none, a user may create an "invisible" post component. For example, a user may want to select a profile of none to create a railing object with gaps between solid fill fencing components or to make a railing object with openings between groups of picket components.

The depth and width dimensions of the post components may be defined respectively using post depth box 354 and post width box 356. In one embodiment, the depth and width of a post component may be modified by selecting and dragging portions of a rendered lower rail component, by entering a numeric value in the respective field, or by manipulating the spinner controls associated with each box to increase or decrease their respective values.

The post extension box 358 allows a user to specify the distance the post components are to extend above the top rail component.

In response to selecting the spacing tool button 353, the user is presented with an interface that allows the user to define the number of post components that are to be included in the railing object and the spacing between each of the post components. For example, in one embodiment, selecting spacing tool button 353 causes a spacing tool interface to be displayed to the user. By interacting with the spacing tool, a user can define the number of, and the spacing between, each of the post components.

The fencing dialog box 360 allows the user to control the geometric dimensions and type of fencing components that are to be included in the railing object. The fencing dialog box 360 may include a type list box 362 and dependent on the selected fencing component type, either a definition section 363 or a solid fill group box 373.

The type list box 362 controls the type of fencing component that will be placed between the posts components within the railing object. In one embodiment, type list box 362 provides a pull-down menu that includes a set of predetermine fencing component types that may be selected for use by the user. For example, the pull-down menu may include predefined fencing components of type picket, of type solid fill or of type none (i.e. no fencing components).

In one embodiment, whether the options shown in definition section 363 or the options shown in definition section 373 are displayed to the user is dependent on the type of fencing component that is selected by the user in type list box 362. For example, when the user selects "Pickets" as the fencing type in the type list box 362, definition section 363 is displayed to allow the user to define the geometric dimensions of the picket components. In one embodiment definition section 363 includes a picket profile box 364, a picket depth box 366, a picket width box 368, a picket extension box 370, a picket bottom offset box 372, and a picket spacing tool button 369.

The picket profile 364 toggle allows the user to select the type of profile the picket component will represent. In one embodiment, the picket profile 364 toggle allows the user to select the picket profile from a list of round or square picket profile components.

The depth and width dimensions of the picket components may respectively be defined using picket depth box 366 and picket width box 368. In one embodiment, the picket depth box 366 and picket width box 368 may be modified by selecting and dragging portions of a rendered fencing component, by entering a numeric value in the respective field, or by manipulating the spinner controls associated with each box to increase or decrease their respective values.

The picket extension box 370 allows the user to control the amount the picket components extend above the top rail component. The picket bottom offset box 372 allows the user to control the amount the picket components are offset from the bottom of the railing object. In one embodiment, this bottom offset defines a distance between the path and where the picket components are to begin.

In response to selecting the spacing tool button 369, the user is presented with an interface that allows the user to define the number of fencing components that are to be included in the railing object and the spacing between each of the fencing components. For example, in one embodiment, selecting spacing tool button 369 causes a spacing tool interface to be displayed to the user. By interacting with the spacing tool, a user can define the number of, and the spacing between, each of the fencing components.

As previously indicated, whether the options shown in definition section 373 are actually displayed to the user is dependent on the type of fencing component that is selected by the user in type list box 362. In one embodiment, when the user selects "Solid Fill" as the fencing type in the type list box 362, definition section 373 is displayed to allow the user to define the geometric dimensions of the picket components. In one embodiment definition section 373 includes a solid fill thickness box 374, a solid fill top offset box 376, a solid fill bottom offset box 378, a solid fill left offset box 380, and a solid fill right offset box 382.

The solid fill thickness box 374 allows the user to set the thickness of the solid fill. The solid fill top offset box 376 allows the user to specify an offset between the solid fill component and the top rail component. The solid fill bottom offset box 378 allows the user to specify an offset between the solid fill component and the bottom of the railing object. The solid fill left offset box 380 allows the user to specify an offset between the solid fill component and the adjacent left post component while the solid fill right offset box 382 allows the user to specify an offset between the solid fill component and the adjacent right post component.

In one embodiment, the solid fill thickness, solid fill top offset, solid fill bottom offset, solid fill left offset, and solid fill right offset of a solid fill component may be modified by selecting and dragging portions of the solid fill component, by entering a numeric value in the respective fields, or by manipulating the spinner controls associated with each box to increase or decrease their respective values.

Defining a Path

In one embodiment, railing objects are automatically made to follow a particular path. For example, a design layout may require that a railing object of type fence be generated such that it surrounds a particular area of a house or that a railing object of type handrail substantially follow the course of a set of stairs.

Various techniques may be used in defining a particular path. For example, a path may be defined by clicking and dragging the mouse to different positions on a display monitor. Alternatively, a path may be defined by entering specific coordinates that define locations within the design layout. A path may be open, closed, and/or multidimensional. In certain embodiments, a set of predefined paths are provided to the user which allows the quick placement of railing objects within a particular design layout. However, the embodiments of the invention are not limited to any particular method for defining a path.

Using Segments to Match the Contours of the Path

Paths and railing objects may have substantially different contours within a design layout. A path may contain a plurality of curves, yet, a railing object (e.g. fence) normally contains a plurality of substantially straight rails extending from post to post which break the entire railing object into segments. In one embodiment, a user may cause a railing object to more closely match the contours of a path by increasing the number of segments that are contained in the railing object. In certain embodiments, the number of segments within a railing object may be increased by increasing the number of post components that are included within the railing object.

Figure 4A:
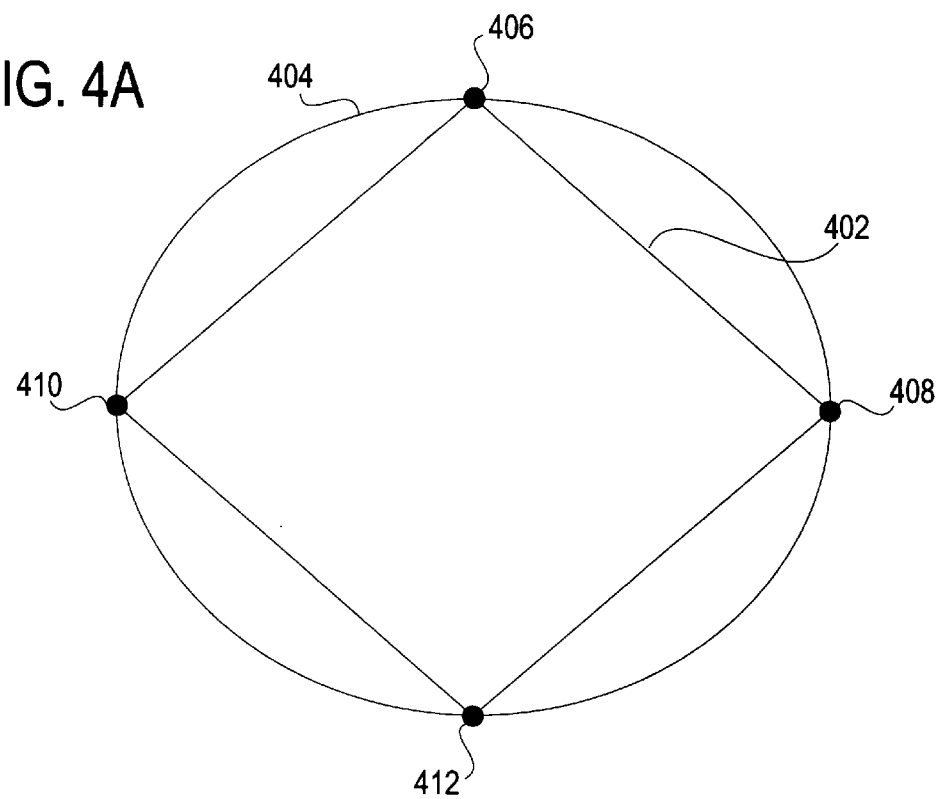
FIG. 4A illustrates a railing object separated into four segments along a closed path.

For example, FIG. 4A illustrates a railing object 402 that has been applied to a circular closed path 404. In this example, railing object 402 includes only four segments as defined by post components 406–412. Because railing object 402 includes only four segments it cannot closely follow the contours of the path 404.

Figure 4B:
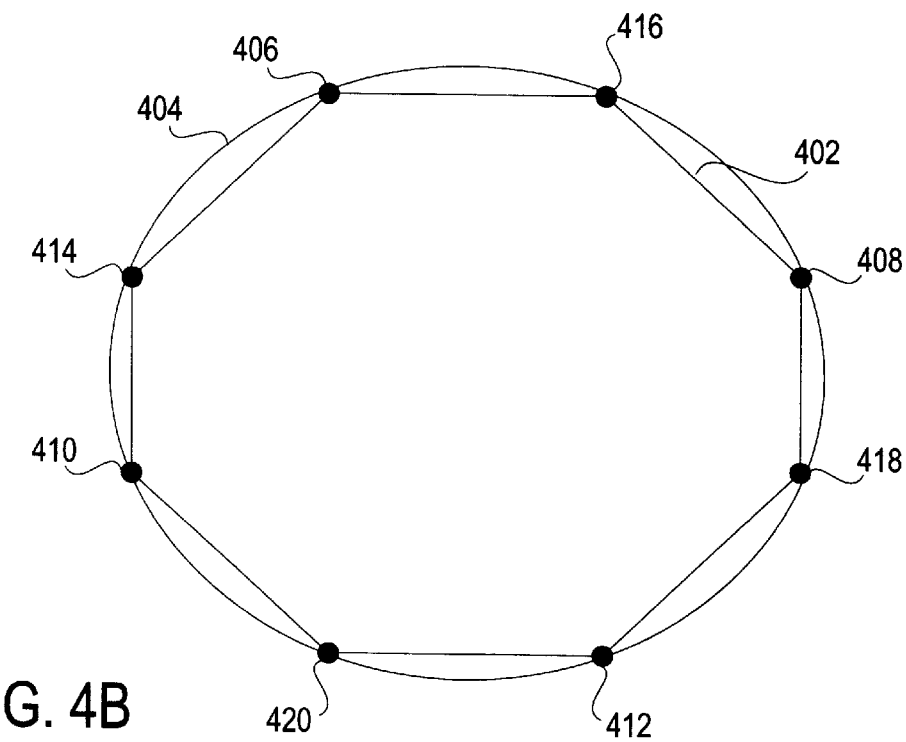
FIG. 4B illustrates a railing object separated into eight segments along a closed path.

However, as illustrated in FIG. 4B, railing object 402 has been modified to include eight segments as defined by post components 406–420. As depicted, by increasing the number segments, railing object 402 can be made to follow circular closed path 404 more closely. Therefore, by increasing the number of segments a railing object can be made to the curvature of a path more closely.

Modifying the Railing Object to Conform with a Redefined Path

At times, design specifications may require a change in the path to which the railing object is to follow. In one embodiment, when a path is modified or altered the railing mechanism automatically adjusts the railing object to follow the modified path. That is, the railing object automatically repositions itself to match the changes in the path without requiring the user to manually reposition each railing object component.

Figure 5A:
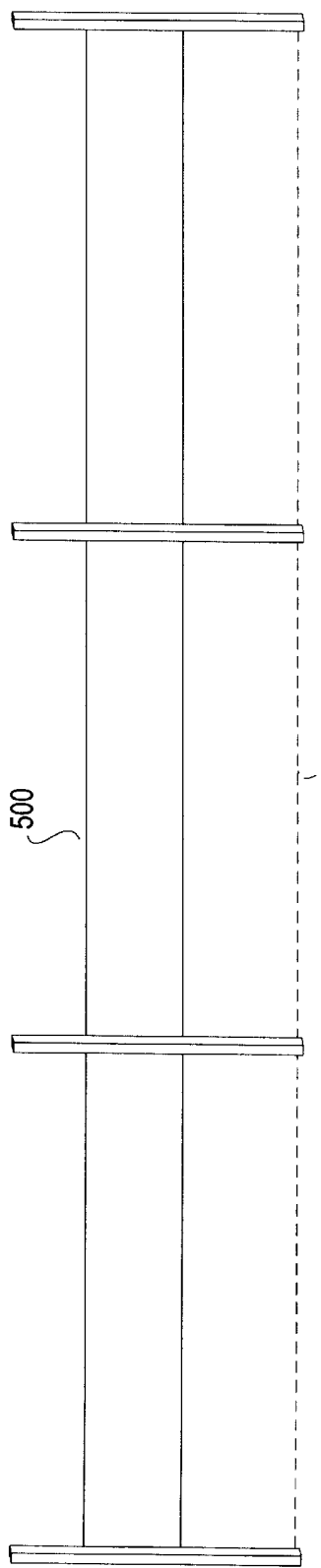
FIG. 5A illustrates a fence type railing object along a first path.
Figure 5B:
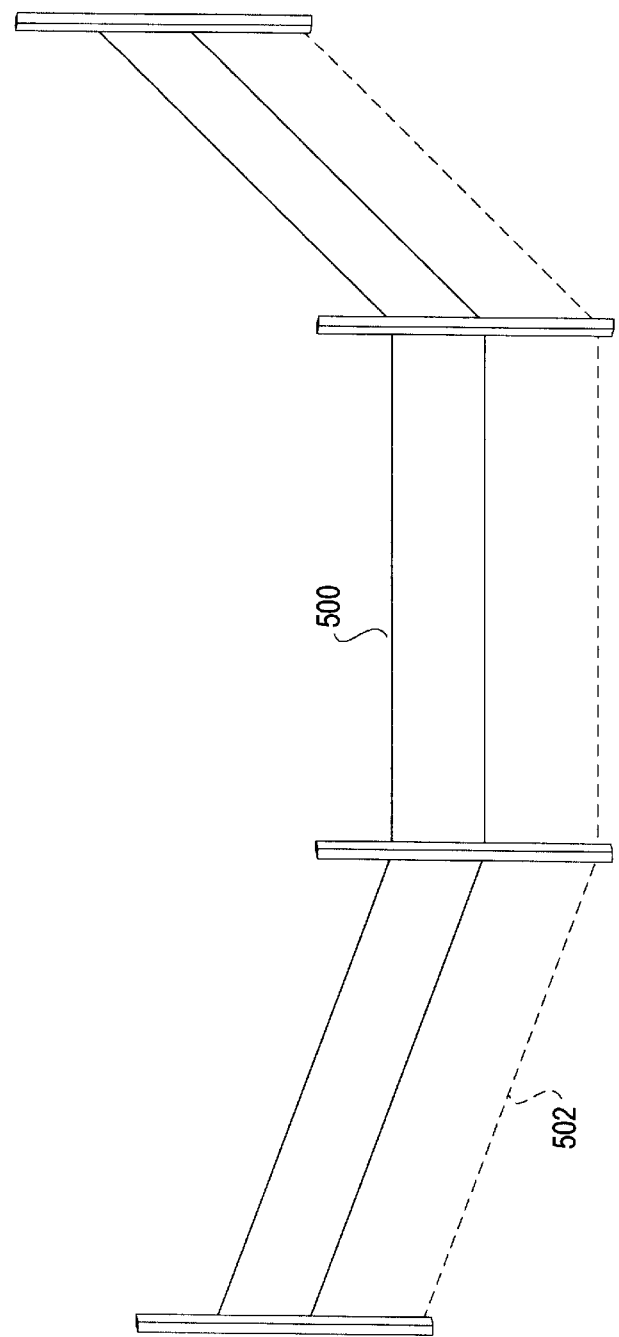
FIG. 5B illustrates how a fence type railing object automatically adjusts to follow an redefined path.

For example, FIG. 5A illustrates a railing object 500 that has been configured to follow a path 502 (dashed lines). If the path 502 is subsequently modified or altered, the railing mechanism automatically causes the railing object 500 to adjust to follow the new position of the path 500 as illustrated in FIG. 5B.

In certain cases, a path's length may be altered so that it is either longer or shorter than its original length. In one embodiment, the railing mechanism automatically adjusts the railing object components to conform to any path length change. For example, if a path is shortened, the railing mechanism automatically adjusts the placement and length of the rail components, the post components and any fencing components to properly correspond to the newly defined path.

Figure 6A:
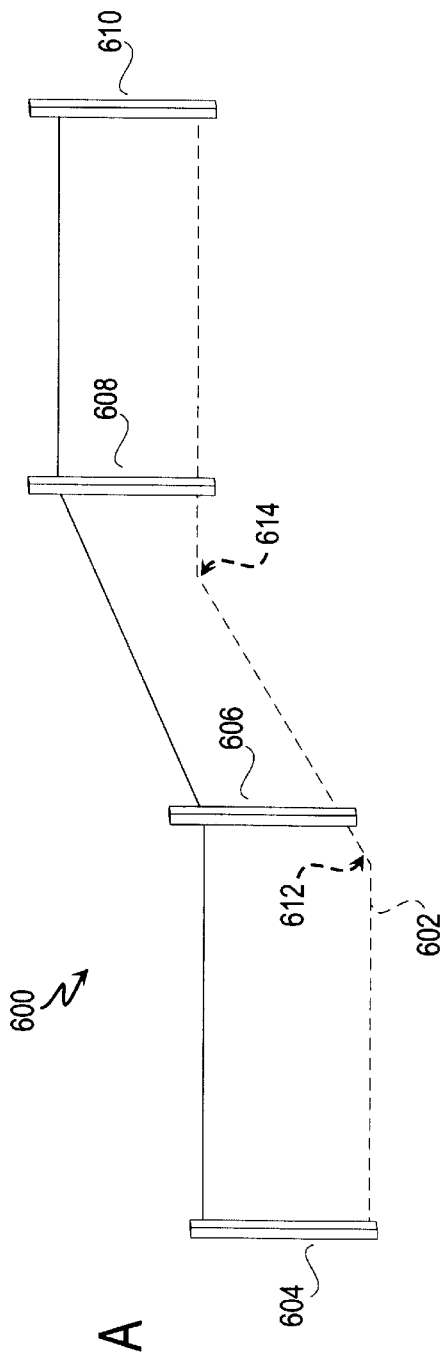
FIG. 6A illustrates how evenly spacing the post components of a railing object along the path may how the railing object follows the path.

Automatic Repositioning of Post Components to Respect the Corners of a Railing Object At times, the position of a post component may not truly model where the user would structurally position a post component. For example, in spacing the post components along a path, the railing mechanism may not place a post component at a particular point where the path pivots or turns into an alternative direction. In certain cases, by not placing a post component at a pivot or turn in the path can cause the railing object to unwontedly divert from the define path. For example, FIG. 6A illustrates a railing object 600 that includes a set of post components 604, 606, 608 and 610. In requesting that post components 604, 606, 608 and 610 be evenly spaced along path 602, the railing mechanism does not include a post component at turns 612 and 614. Thus, as depicted in FIG. 6A, railing object does not present a realistic view of where the post components should be placed so as to best follow path 602.

Figure 6B:
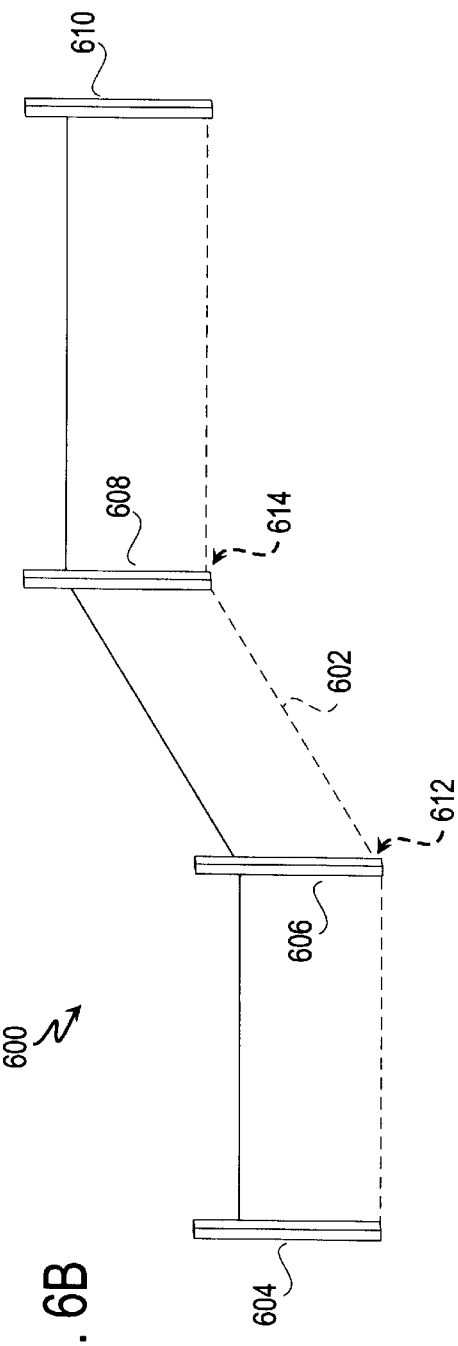
FIG. 6B illustrates the railing mechanism may automatically adjust the location of the post components to cause the railing object to more closely follow the defined path.

In certain embodiments, in response to selecting the respect corners option, that was previously described above, the railing mechanism automatically adjusts where the post components are placed so as to respect the turns or pivots that are included in a path. For example, FIG. 6B illustrates the placement of post components 604, 606, 608 and 610 in response to selecting the respect corners option. As depicted, post components 606 and 608 have been respectively located at turns 612 and 614 in path 602. By respectively locating post components 606 and 608 at turns 612 and 614, the railing mechanism causes railing object 600 to more closely follow path 602 and can produce a more accurate and realistic view of where each post component is to be located.

Figure 6C:
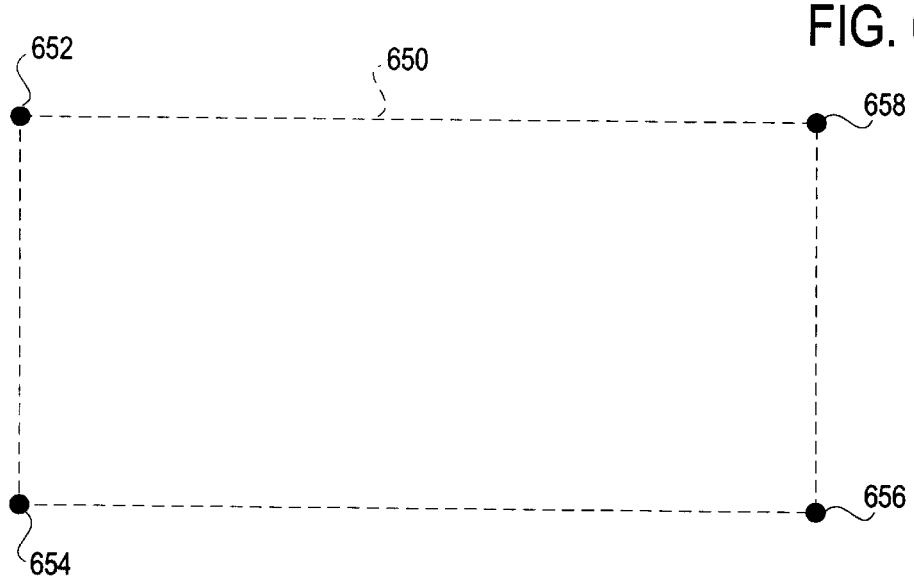
FIG. 6C illustrates possible placing of post components in a square path.

In certain embodiments, the railing mechanism may need to add additional post components to the railing object in order to respect the turns or pivots that are included in a path. For example, FIG. 6C illustrates a path 650 that has been defined for a railing object to follow. In this example, the railing mechanism has placed post components 652, 654, 565 and 658 at each corner of path 650.

Figure 6D:
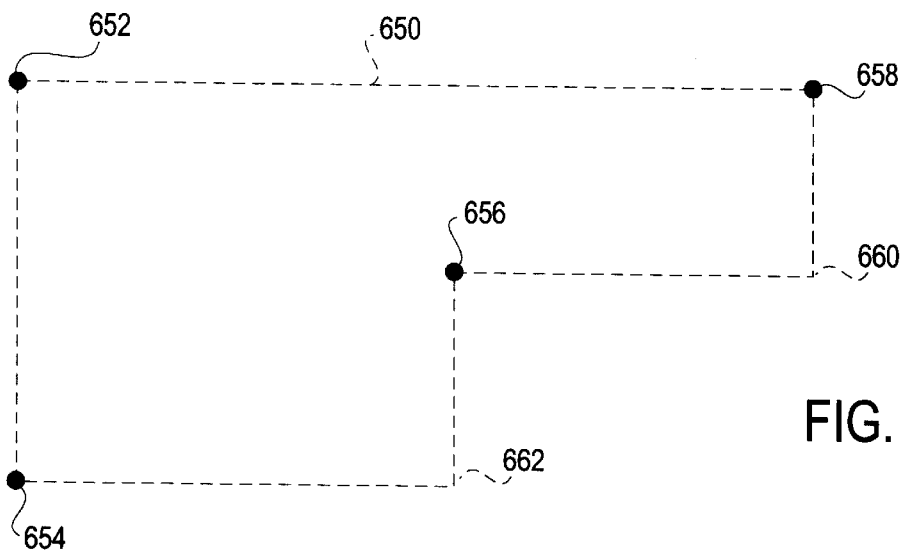
FIG. 6D illustrates how modifying the path may cause an inaccurate positioning of the post components in a square path.

FIG. 6D illustrates a modified path 650 that has been redefined by the user. As depicted, path 650 now includes additional corners 660 and 662. However, because the railing object only includes four post components 652, 654, 565 and 658, additional post components are required to have a post components at each corner.

Figure 6E:
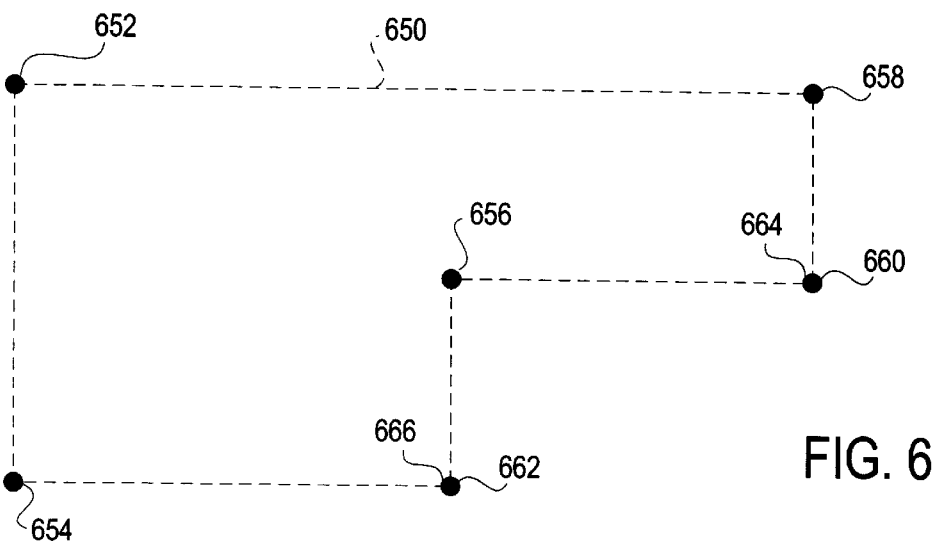
FIG. 6E illustrates how the railing mechanism automatically adds additional post components to the railing object in order to allow the railing object to better follow a redefined path.

In one embodiment, upon detecting that path 650 has been modified, the railing mechanism automatically adds additional post components 664 and 666 at additional corners 660 and 662 as depicted in FIG. 6E. By adding the additional post components 664 and 666 the railing object can substantially follow redefined path 650 and thus produce a more accurate and realistic view of where each post component is to be located.

Figure 6F:
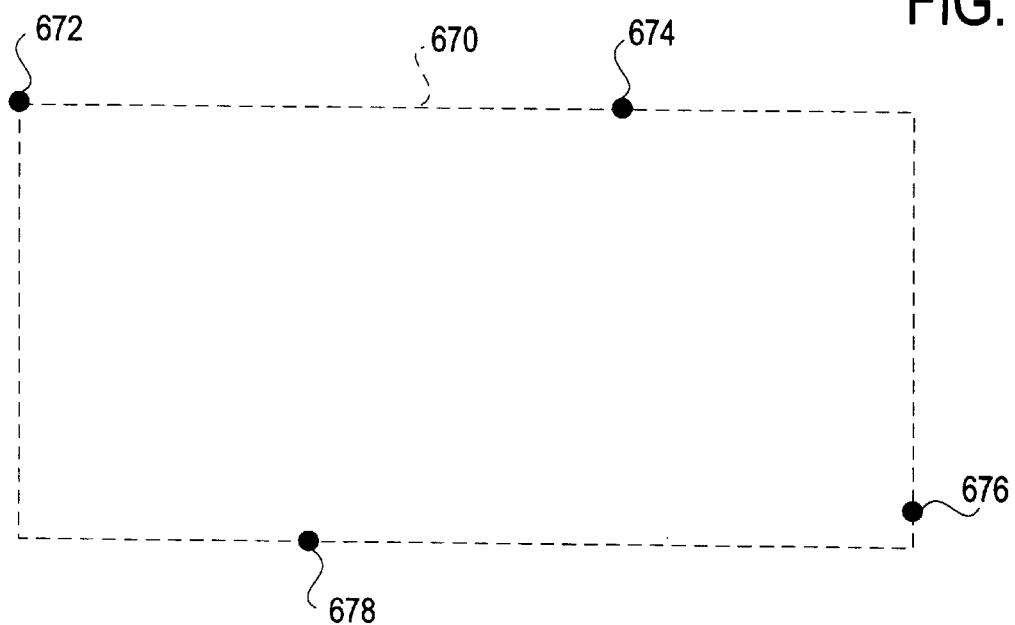
FIG. 6F illustrates how requiring the post components to be evenly spaced along a path can cause the post components to not be placed at key points along the path.
Figure 6G:
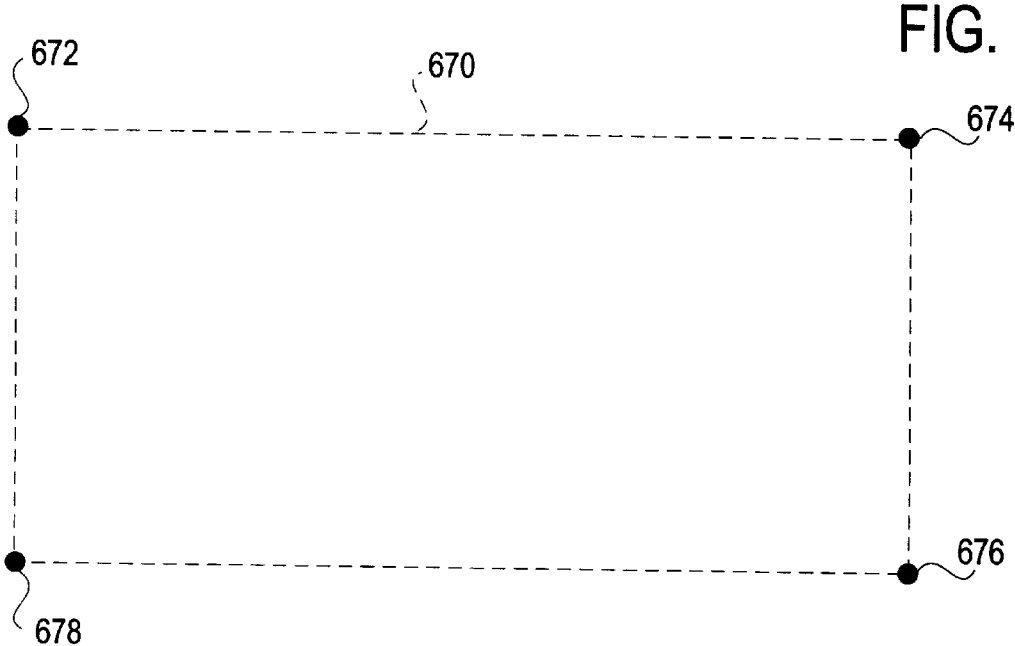
FIG. 6G illustrates how the railing mechanism can automatically adjust the placement of post components in order to allow the railing object to better follow a redefined path.

In certain embodiments, selecting the respect corners options may cause the railing mechanism to override where a post component is to be located. For example, referring to FIG. 6F and FIG. 6G, if the user has selected the respect corners option and has requested that four post be positioned evenly over a path 670, instead of evenly placing post components 672, 674, 676 and 678 on path 670 as shown in FIG. 6F, the railing mechanism will automatically adjust the placement of posts components 672, 674, 676 and 678 on path 670 on path 670 as depicted in FIG. 6G.

Process for Generating a Railing Object

Figure 7:
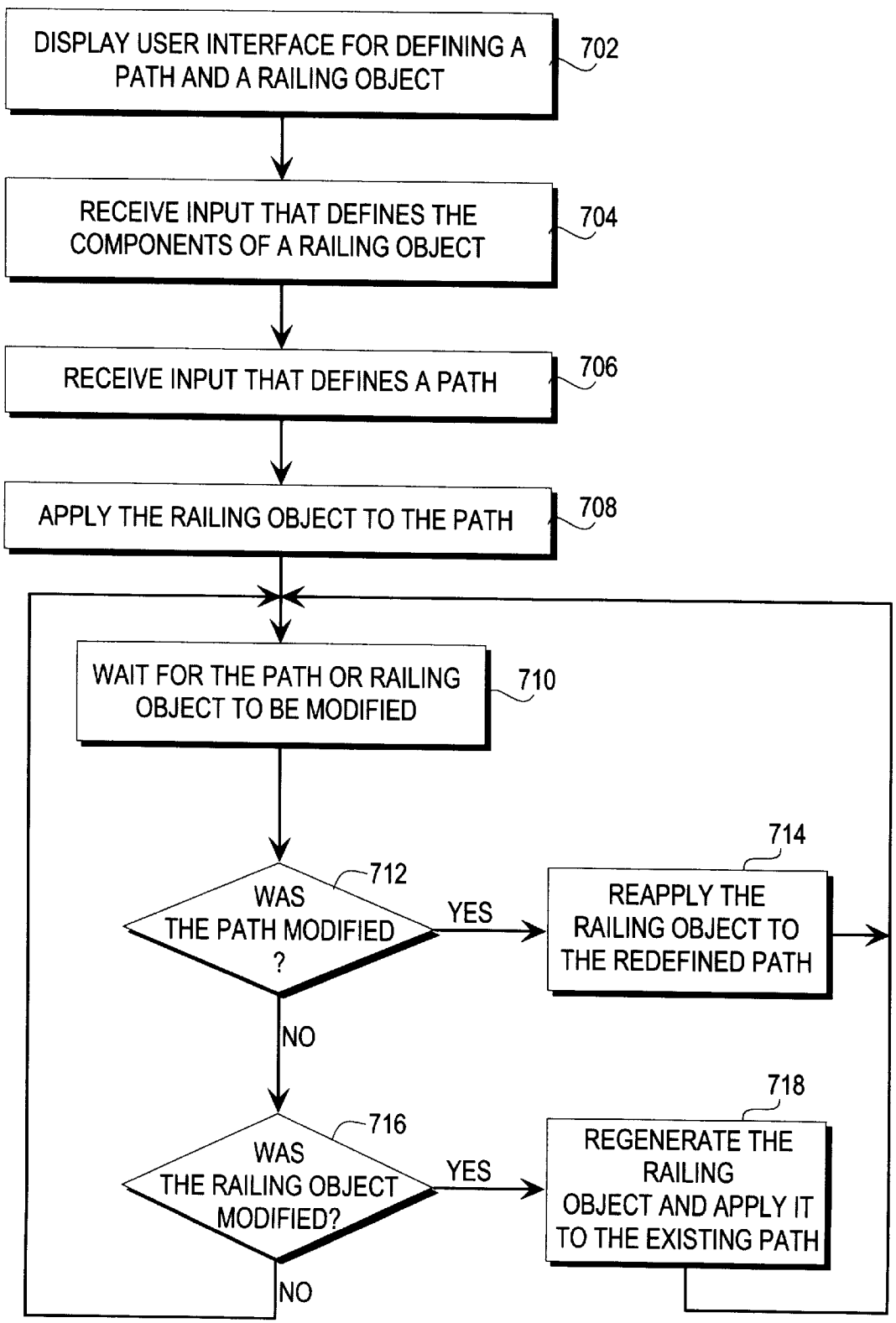
FIG. 7 illustrates a flow diagram of a method for generating a generic railing object and causing it to follow a defined path.

FIG. 7 illustrates a flow diagram of a process for generating a generic railing object. For explanation purposes, the steps of FIG. 7 will be described in reference to the components of FIG. 3, FIG. 5A and FIG. 5B.

At step 702, a user interface control menu is displayed to allow the user to define a railing object and path for which the railing object is to follow. For example, the user may be presented with a user interface control menu 300 as previously described in FIG. 3.

At step 704, the user interacts with the interface control menu to define a path that a railing object is to follow. For example, by interacting the with the interface control menu the user may define path 502 as illustrated in FIG. 5A.

At step 706, the user interacts with the interface control menu to define the component attributes that are to makeup a railing object. For example, by interacting the with the interface control menu the user may define the railing object components that makeup railing object 500 as illustrated in FIG. 5A.

At step 708, the railing mechanism generates a railing object based on the defined component attributes and automatically causes the railing object to follow the path. For example, as depicted in FIG. 5A, in applying railing object 500 to path 502, railing object 500 is positioned such that it substantially follows path 502.

At step 710, the railing mechanism waits for the user to modify the components of the railing object or to redefine the path.

At step 712, if the railing mechanism detects the path has been altered, at step 714 the railing object is reapplied to the new path.

At step 716, if the railing mechanism detects that one or more of the railing object components have been modified, at step 718 the railing object is regenerated based on the component modifications and then reapplied the existing path.

Alternatives, Extensions

A railing mechanism for generating a railing object is provided. This railing mechanism allows railing objects to be generated for a defined path. If the path is redefined, the railing mechanism automatically updates the railing object so as to follow the redefined path. By providing a user interface control menu, a user can easily define the different components that are to be included in railing object. This interface also allows the user to easily modify the railing object components in groups such that the user is not required to meticulously update each of the individual components. By providing additional placement options, such as the respect corners options, the railing mechanism allows the user to better control where different components are to be placed on the path.

In describing certain embodiments of the invention, several drawing figures have been used for explanation purposes. However, the invention is not limited to any particular context as shown in drawing figures, and the spirit and scope of the invention include other contexts and applications in which the railing mechanism described herein may be used. Thus, the specification and drawings are, accordingly, to be regarded in an illustrative rather than a restrictive sense.

In addition, in this disclosure, including in the claims, certain process steps are set forth in a particular order, and alphabetic and alphanumeric labels are used to identify certain steps. For example, the order of steps 704 and 706 may be reversed in certain application so as to allow the path to be defined after the railing object is defined. Thus, unless specifically stated in the disclosure, embodiments of the invention are not limited to any particular order of carrying out such steps. In particular, the labels are used merely for convenient identification of steps, and are not intended to imply, specify or require a particular order of carrying out such steps.

What is claimed is:

1. A method for generating railing objects, the method comprising the computer implemented steps of:

receiving input that defines a railing object, wherein the railing object includes a plurality of post components and a plurality of rail components, wherein the plurality of rail components intersect each of the plurality of post components in at least one place, wherein between each pair of adjacent post components of the plurality of post components the plurality of rail components are vertically spaced relative to each other;

receiving input that defines a path for said railing object; and automatically applying said railing object to said path by causing at least one end of each of the plurality of post components to begin adjacent to said path.

2. A method for generating railing objects, the method comprising the computer implemented steps of:

receiving input that defines a railing object, wherein the railing object includes a plurality of post components and one or more rail components, wherein the one or more rail components intersect each of the plurality of post components in at least one place;

receiving input that defines a path for said railing object;

automatically applying said railing object to said path by causing at least one end of each of the plurality of post components to begin adjacent to said path;

receiving input that redefines the path for said railing object; and in response to redefining the path, reapplying said railing object to said path by causing at least one end of each of the plurality of post components to begin adjacent to said path.

3. A method for generating railing objects, the method comprising the computer implemented steps of:

receiving input that defines a railing object, wherein the railing object includes a plurality of post components and one or more rail components, wherein the one or more rail components intersect each of the plurality of post components in at least one place;

receiving input that defines a path for said railing object;

automatically applying said railing object to said path by causing at least one end of each of the plurality of post components to begin adjacent to said path;

wherein the step of receiving input that defines the path comprises the steps of:

receiving a first set of coordinates that define a first location;

receiving a second set of coordinates that define a second location; and determining a two or more dimensional path based on said first and second locations.

4. A method for generating an object, the method comprising the computer implemented steps of:
receiving input that defines a path for said object;
generating a plurality of post components for said object, wherein the plurality of post components are substantially perpendicular to said path;
generating one or more rail components for said object, wherein the one or more rail components intersect each of the plurality of post components in at least one place, wherein the intersection forms an angle that is substantially ninety degrees;
automatically applying said object to said path by causing at least one end of each of the plurality of post components to begin adjacent to the path;
wherein the step of generating the one or more rail components includes the steps of:
determining one or more attributes for each of the one or more rail components; and
establishing attribute values for the one or more attributes, wherein the attribute values determine the dimensions of each of the one or more rail components.

5. A method for generating an object, the method comprising the computer implemented steps of:
receiving input that defines a path for said object;
generating a plurality of post components for said object, wherein the plurality of post components are substantially perpendicular to said path;
generating one or more rail components for said object, wherein the one or more rail components intersect each of the plurality of post components in at least one place, wherein the intersection forms an angle that is substantially ninety degrees;
automatically applying said object to said path by causing at least one end of each of the plurality of post components to begin adjacent to the path;
wherein the step of generating the plurality of post components includes the steps of:
determining one or more attributes for each of the post components; and
establishing attribute values for the one or more attributes, wherein the attribute values determine the dimensions of each of the post components.

6. A method for generating railing objects, the method comprising the computer implemented steps of:
receiving input that defines a railing object, wherein the railing object includes a plurality of post components and one or more rail components, wherein the one or more rail components intersect each of the plurality of post components in at least one place;
receiving input that defines a path for said railing object;
automatically applying said railing object to said path by causing at least one end of each of the plurality of post components to begin adjacent to said path;
wherein:
the railing object is a fence object;
the one or more rail components include one or more rail objects;
the plurality of post components include a plurality of post objects; and
the step of receiving input that defines a railing object includes the step of generating the railing object by associating the one or more rail objects with the plurality of post objects to generate the fence object.

7. A method for generating railing objects, the method comprising the computer implemented steps of:
receiving input that defines a railing object, wherein the railing object includes a plurality of post components and one or more rail components, wherein the one or more rail components intersect each of the plurality of post components in at least one place;
receiving input that defines a path for said railing object;
automatically applying said railing object to said path by causing at least one end of each of the plurality of post components to begin adjacent to said path;
receiving update information that modifies the path definition; and
in response to receiving the update information, generating the one or more parallel components and the plurality of perpendicular components for said object based on said update information.

8. A method for generating railing objects, the method comprising the computer implemented steps of:
receiving input that defines a railing object, wherein the railing object includes a plurality of post components and one or more rail components, wherein the one or more rail components intersect each of the plurality of post components in at least one place;
receiving input that defines a path for said railing object;
automatically applying said railing object to said path by causing at least one end of each of the plurality of post components to begin adjacent to said path;
wherein the step of applying said railing object to said path includes the steps of:
identifying a location on said path for placing each of the post components; and
causing each of the plurality of post components to be substantially perpendicular to said path by placing the post components perpendicular to a tangent of said path at each of the identified locations.

9. A computer-readable medium carrying one or more sequences of instructions for generating railing objects, wherein execution of the one or more sequences of instructions by one or more processors causes the one or more processors to perform the steps of:
receiving input that defines a railing object, wherein the railing object includes a plurality of post components and a plurality of rail components, wherein the plurality of rail components intersect each of the plurality of post components in at least one place, wherein between each pair of adjacent post components of the plurality of post components the plurality of rail components are vertically spaced relative to each other;
receiving input that defines a path for said railing object; and
automatically applying said railing object to said path by causing at least one end of each of the plurality of post components to begin adjacent to said path.

10. A computer-readable medium carrying one or more sequences of instructions for generating railing objects, wherein execution of the one or more sequences of instructions by one or more processors causes the one or more processors to perform the steps of:
receiving input that defines a railing object, wherein the railing object includes a plurality of post components and one or more rail components, wherein the one or more rail components intersect each of the plurality of post components in at least one place;
receiving input that defines a path for said railing object;

automatically applying said railing object to said path by causing at least one end of each of the plurality of post components to begin adjacent to said path;

receiving input that redefines the path for said railing object; and in response to redefining the path, reapplying said railing object to said path by causing at least one end of each of the plurality of post components to begin adjacent to said path.

11. A computer-readable medium carrying one or more sequences of instructions for generating railing objects, wherein execution of the one or more sequences of instructions by one or more processors causes the one or more processors to perform the steps of:

receiving input that defines a railing object, wherein the railing object includes a plurality of post components and one or more rail components, wherein the one or more rail components intersect each of the plurality of post components in at least one place;

receiving input that defines a path for said railing object;

automatically applying said railing object to said path by causing at least one end of each of the plurality of post components to begin adjacent to said path;

wherein the instructions for receiving input that defines the path further comprise instructions which, when executed by the one or more processors, cause the one or more processors to carry out the steps of:

receiving a first set of coordinates that define a first location;

receiving a second set of coordinates that define a second location; and determining a two or more dimensional path based on said first and second locations.

12. A computer-readable medium carrying one or more sequences of instructions for generating railing objects, wherein execution of the one or more sequences of instructions by one or more processors causes the one or more processors to perform the steps of:

receiving input that defines a railing object, wherein the railing object includes a plurality of post components and one or more rail components, wherein the one or more rail components intersect each of the plurality of post components in at least one place;

receiving input that defines a path for said railing object;

automatically applying said railing object to said path by causing at least one end of each of the plurality of post components to begin adjacent to said path;

wherein:
the railing object is a fence object;
the one or more rail components include one or more rail objects;
the plurality of post components include a plurality of post objects; and
wherein the instructions for receiving input that defines a railing object further comprise instructions which, when executed by the one or more processors, cause the one or more processors to carry out the step of generating the railing object by associating the one or more rail objects with the plurality of post objects to generate the fence object.

13. A computer-readable medium carrying one or more sequences of instructions for generating railing objects, wherein execution of the one or more sequences of instructions by one or more processors causes the one or more processors to perform the steps of:

receiving input that defines a railing object, wherein the railing object includes a plurality of post components and one or more rail components, wherein the one or more rail components intersect each of the plurality of post components in at least one place;

receiving input that defines a path for said railing object;

automatically applying said railing object to said path by causing at least one end of each of the plurality of post components to begin adjacent to said path;

receiving update information that modifies the path definition; and in response to receiving the update information, generating the one or more parallel components and the plurality of perpendicular components for said object based on said update information.

14. A computer-readable medium carrying one or more sequences of instructions for generating railing objects, wherein execution of the one or more sequences of instructions by one or more processors causes the one or more processors to perform the steps of:

receiving input that defines a railing object, wherein the railing object includes a plurality of post components and one or more rail components, wherein the one or more rail components intersect each of the plurality of post components in at least one place;

receiving input that defines a path for said railing object;

automatically applying said railing object to said path by causing at least one end of each of the plurality of post components to begin adjacent to said path;

wherein the instructions for applying said railing object to said path further comprise instructions which, when executed by the one or more processors, cause the one or more processors to carry out the steps of:

identifying a location on said path for placing each of the post components; and causing each of the plurality of post components to be substantially perpendicular to said path by placing the post components perpendicular to a tangent of said path at each of the identified locations.

15. A computer-readable medium carrying one or more sequences of instructions for generating an object, wherein execution of the one or more sequences of instructions by one or more processors causes the one or more processors to perform the steps of:

receiving input that defines a path for said object;

generating a plurality of post components for said object, wherein the plurality of post components are substantially perpendicular to said path;

generating one or more rail components for said object, wherein the one or more rail components intersect each of the plurality of post components in at least one place, wherein the intersection forms an angle that is substantially ninety degrees;

automatically applying said object to said path by causing at least one end of each of the plurality of post components to begin adjacent to the path;

wherein the instructions for generating the one or more rail components further comprise instructions which, when executed by the one or more processors, cause the one or more processors to carry out the steps of:

determining one or more attributes for each of the one or more rail components; and establishing attribute values for the one or more attributes, wherein the attribute values determine the dimensions of each of the one or more rail components.

16. A computer-readable medium carrying one or more sequences of instructions for generating an object, wherein execution of the one or more sequences of instructions by one or more processors causes the one or more processors to perform the steps of:

receiving input that defines a path for said object;

generating a plurality of post components for said object, wherein the plurality of post components are substantially perpendicular to said path;

generating one or more rail components for said object, wherein the one or more rail components intersect each of the plurality of post components in at least one place, wherein the intersection forms an angle that is substantially ninety degrees;

automatically applying said object to said path by causing at least one end of each of the plurality of post components to begin adjacent to the path;

wherein the instructions for generating the plurality of post components further comprise instructions which, when executed by the one or more processors, cause the one or more processors to carry out the steps of:

determining one or more attributes for each of the post components; and establishing attribute values for the one or more attributes, wherein the attribute values determine the dimensions of each of the post components.

* * * * *